US008623696B2

(12) United States Patent
Cho et al.

(10) Patent No.: US 8,623,696 B2
(45) Date of Patent: Jan. 7, 2014

(54) METHOD OF FORMING EMISSION LAYER OF ORGANIC LIGHT EMITTING DISPLAY DEVICE, METHOD OF MANUFACTURING ORGANIC LIGHT EMITTING DISPLAY DEVICE INCLUDING EMISSION LAYER, AND ORGANIC LIGHT EMITTING DISPLAY DEVICE THEREOF

(75) Inventors: Sung-Hwan Cho, Yongin (KR); Hyo-Seok Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 29 days.

(21) Appl. No.: 13/235,671

(22) Filed: Sep. 19, 2011

(65) Prior Publication Data

US 2012/0097931 A1    Apr. 26, 2012

(30) Foreign Application Priority Data

Oct. 25, 2010    (KR) .......................... 10-2010-0104183

(51) Int. Cl.
*H01L 51/40*    (2006.01)

(52) U.S. Cl.
USPC .................... 438/99; 438/34; 438/82; 438/28; 257/40; 257/79; 257/642; 313/497; 313/498; 313/499; 313/450; 313/310

(58) Field of Classification Search
USPC ....................... 257/9–103, E51.011–E51.015, 257/E51.026, E33.061, E31.095–E31.096, 257/642, E39.007; 438/34–35, 82, 99, 28, 438/956; 313/497–500, 310–311
See application file for complete search history.

(56) References Cited

U.S. PATENT DOCUMENTS

| 6,394,578 | B1 | 5/2002 | Akahira et al. |
| 2005/0208332 | A1* | 9/2005 | Chin et al. .................... 428/690 |
| 2006/0125363 | A1 | 6/2006 | Tahira et al. |

FOREIGN PATENT DOCUMENTS

| JP | 2007-305507 | 11/2007 |
| JP | 4062354 | 1/2008 |
| KR | 10-0583910 | 5/2006 |
| KR | 10-2010-0042345 | 4/2010 |

* cited by examiner

*Primary Examiner* — Steven Loke
*Assistant Examiner* — Cuong B Nguyen
(74) *Attorney, Agent, or Firm* — Robert E. Bushnell, Esq.

(57) ABSTRACT

A method of forming an emission layer by using droplets and an emission part on which charges with opposite polarities are induced, a method of manufacturing an organic light emitting display device including the emission layer, and the organic light emitting display device thereof, the method includes inducing charges having a first charge polarity on emission portions by facing a surface of a mask and a surface of a substrate, contacting the charge inducing units of the mask to the emission portions of the substrate, and then separating the mask from the substrate, supplying droplets exhibiting a second and opposite charge polarity to the substrate and forming the emission layer by allowing droplets exhibiting the second charge polarity to be attracted to and move to the emission portions exhibiting the first charge polarity.

17 Claims, 11 Drawing Sheets

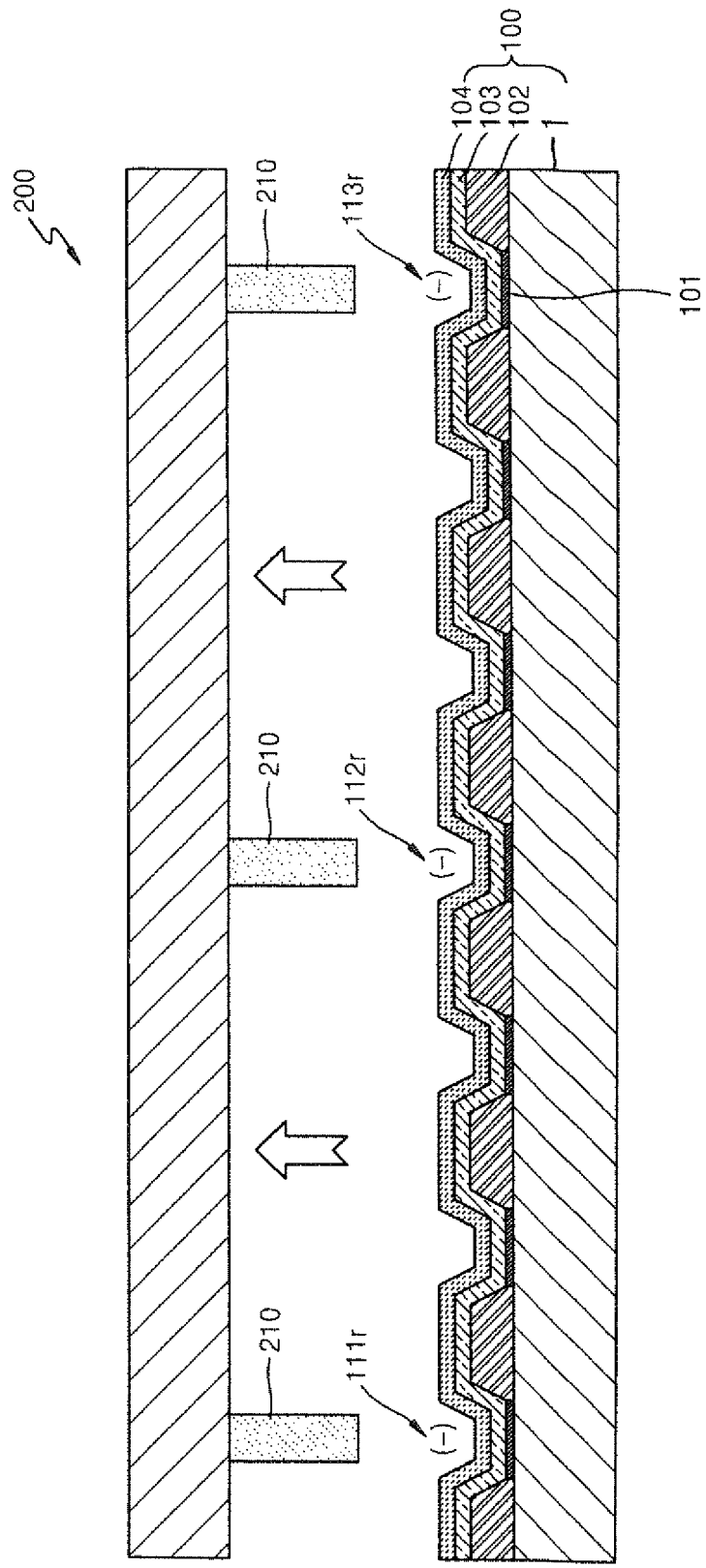

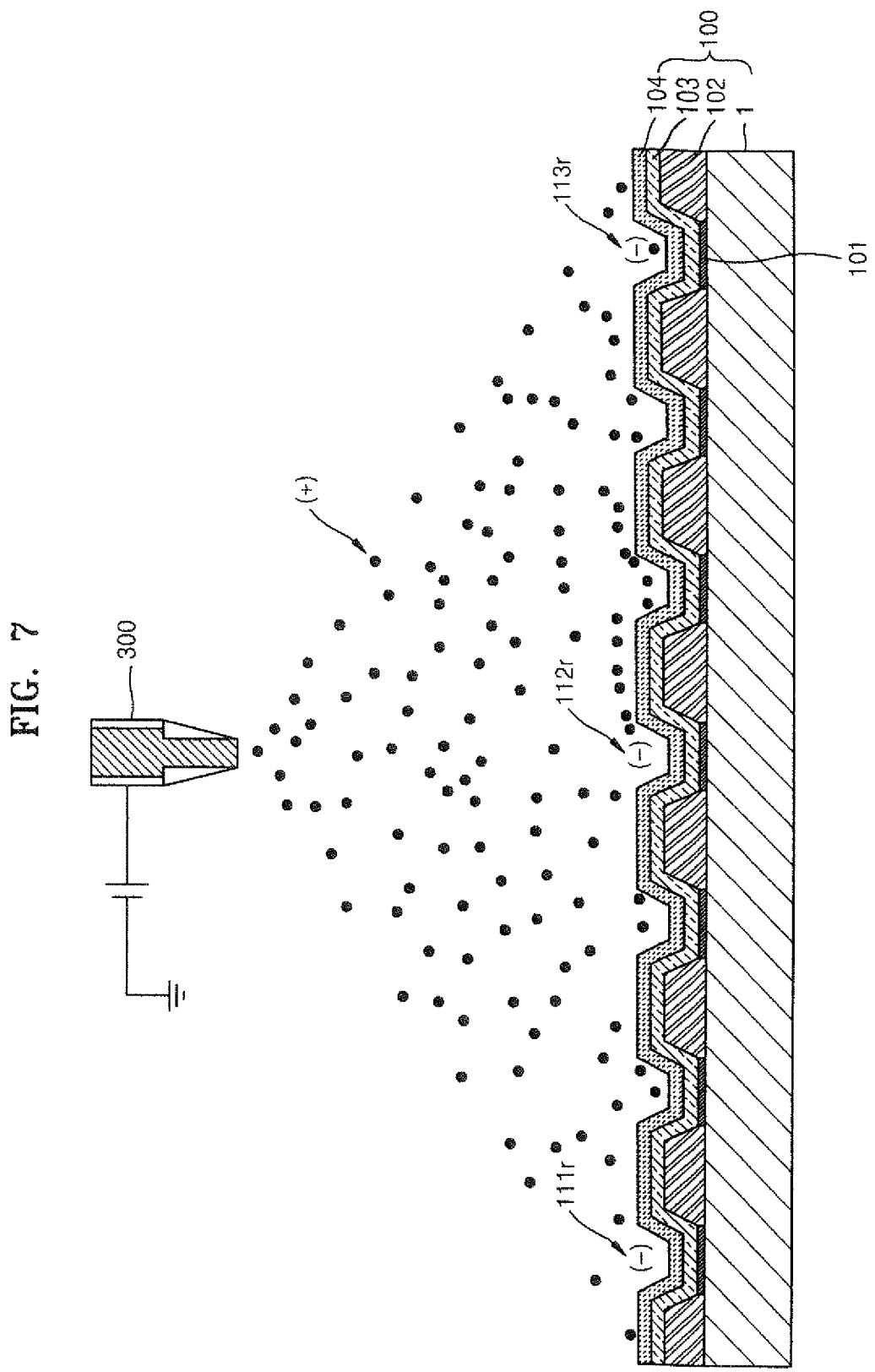

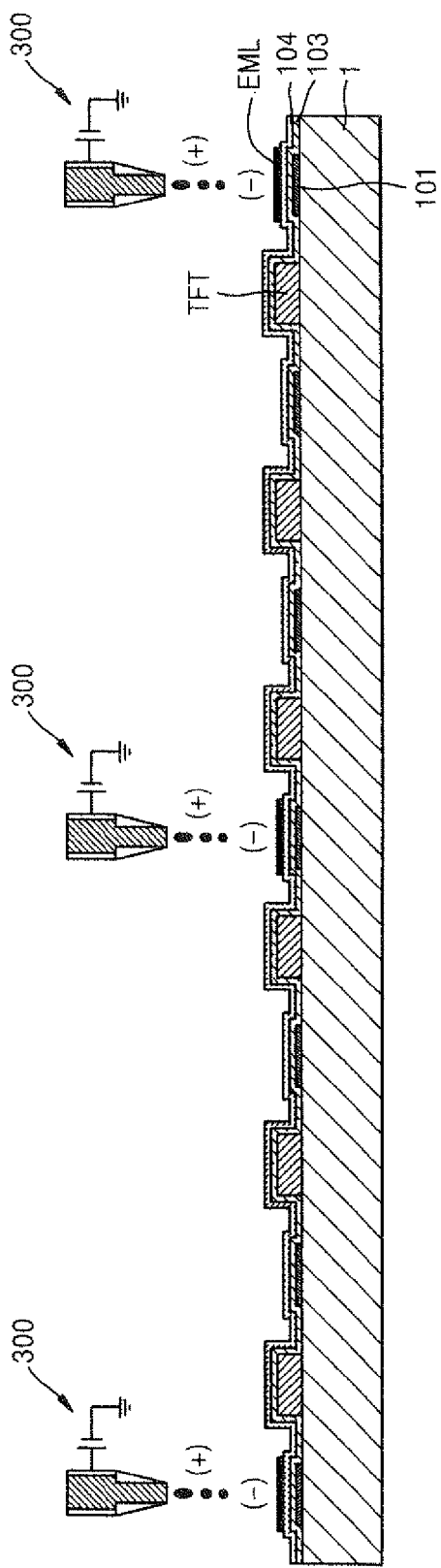

METHOD OF FORMING EMISSION LAYER OF ORGANIC LIGHT EMITTING DISPLAY DEVICE, METHOD OF MANUFACTURING ORGANIC LIGHT EMITTING DISPLAY DEVICE INCLUDING EMISSION LAYER, AND ORGANIC LIGHT EMITTING DISPLAY DEVICE THEREOF

CLAIM OF PRIORITY

This application makes reference to, incorporates the same herein, and claims all benefits accruing under 35 U.S.C. §119 from an application for METHOD OF FORMING EMISSION LAYER OF ORGANIC LIGHT EMITTING DISPLAY DEVICE, METHOD OF MANUFACTURING ORGANIC LIGHT EMITTING DISPLAY DEVICE INCLUDING EMISSION LAYER, AND ORGANIC LIGHT EMITTING DISPLAY DEVICE THEREOF earlier filed in the Korean Intellectual Property Office on 25 Oct. 2010 and there duly assigned Ser. No. 10-2010-0104183.

BACKGROUND OF THE INVENTION

1. Field of the Invention

The present invention relates to a method of forming an emission layer of an organic light emitting display device, a method of manufacturing the organic light emitting display device including the emission layer, and the organic light emitting display device thereof.

2. Description of the Related Art

An organic light emitting display device that is an active matrix type display device is expected to become a next generation display device due to its wide viewing angle, high contrast, and fast response speed.

The organic light emitting display device is manufactured by forming an anode on a glass or a transparent insulating substrate according to a predetermined pattern and then by sequentially stacking an organic material and a cathode on the anode. When a voltage is applied to the anode and the cathode of the organic light emitting display device, a hole injected from the anode moves to an emission layer via a hole transport layer (HTL), and an electron is injected from the cathode to the emission layer via an electron transport layer (ETL). The electron and the hole are recombined in the emission layer and thus an exciton is formed, and when the exciton is changed from an excitation state to a ground state, an organic molecule of the emission layer emits light and thus an image is realized.

In order to manufacture an organic light emitting display device capable of realizing a full color spectrum, in general, a unit pixel is formed by independently depositing a red emission layer for a red subpixel (R), a green emission layer for a green subpixel (G), and a blue emission layer for a blue subpixel (B) on a substrate by using a mask whereon patterned openings are formed. However, the use of the mask having the openings limits manufacturing of a large display.

SUMMARY OF THE INVENTION

The present invention provides a method of forming an emission layer by using droplets and an emission part on which charges with different polarities are induced, a method of manufacturing an organic light emitting display device including the emission layer, and the organic light emitting display device thereof.

According to an aspect of the present invention, there is provided a method of forming an emission layer of an organic light emitting display device, the method including providing a substrate including at least one pixel comprising emission portions are arranged on a surface of the substrate, providing a mask including a plurality of charge inducing units arranged on a surface of the mask that correspond to locations of the emission portions, inducing charges having a first charge polarity on the emission portions by facing the surface of the mask and the surface of the substrate, contacting the charge inducing units of the mask to the emission portions of the substrate, and then separating the mask from the substrate, supplying droplets exhibiting a second and opposite charge polarity to the substrate and forming the emission layer by allowing droplets exhibiting the second charge polarity to be attracted to and move to the emission portions exhibiting the first charge polarity.

The one or more pixels each include one or more subpixels and the one or more subpixels comprise emission parts on which different types of emission layers are to be formed, and wherein, when the one or more subpixels include different emission parts are sequentially and alternately arranged in a row direction on the substrate, and the one or more subpixels include the same emission parts are arranged in a column direction on the substrate, the mask comprises the charge inducing units corresponding to locations of same emission parts of the one or more subpixels. Surfaces of the emission portions contacting the charge inducing units are made out of a non-conductive material, and the charge inducing units are comprised of a conductive material. An area and a shape of each of the charge inducing units contacting the emission portions are equivalent to an area and a shape of each of the emission portions. After the charge inducing units of the mask contact the emission portions of the substrate, charges having the first charge polarity are induced on the emission portions by applying a voltage to the mask. The droplets may be charged to have the second charge polarity by applying a voltage to a nozzle that supplies the droplets. The supplying of the droplets exhibiting the second charge polarity includes thoroughly spraying the droplets on the surface of the substrate. The supplying of the droplets exhibiting the second charge polarity includes dripping the droplets from locations corresponding to the emission portions.

According to another aspect of the present invention, there is provided a method of manufacturing an organic light emitting display device, the method including forming a first electrode layer having a predetermined pattern on a substrate, forming an intermediate layer arrangement comprising an emission layer having a predetermined pattern on the first electrode layer and forming a second electrode layer having a predetermined pattern on the intermediate layer arrangement, wherein the forming of the emission layer includes providing the substrate, wherein one or more pixels comprising emission portions are arranged on a surface of the substrate, providing a mask that includes a plurality of charge inducing units arranged at locations on a surface of the mask that correspond to locations of the emission portions, inducing charges having a first charge polarity on the emission portions by facing the surface of the mask and the surface of the substrate, contacting the charge inducing units of the mask to the emission portions of the substrate, and then separating the mask from the substrate, supplying droplets exhibiting a second and opposite charge polarity to the substrate and forming the emission layer by allowing the droplets exhibiting the second charge polarity to move to the emission portions exhibiting the first charge polarity.

The one or more pixels each include one or more subpixels and the one or more subpixels comprise emission parts on which different types of emission layers are to be formed, and wherein, when the one or more subpixels including different emission parts are sequentially and alternately arranged in a row direction on the substrate, and the one or more subpixels including the same emission parts are arranged in a column direction on the substrate, the mask includes the charge inducing units corresponding to locations of same emission parts of the one or more subpixels. Surfaces of the emission portions contacting the charge inducing units include a non-conductive material, and the charge inducing units include a conductive material. An area and a shape of each of the charge inducing units contacting the emission portions may be equivalent to an area and a shape of each of the emission portions. After the charge inducing units of the mask contact the emission portions of the substrate, charges having the first charge polarity may be induced on the emission portions by applying a voltage to the mask. The droplets may be charged to have the second charge polarity by applying a voltage to a nozzle that supplies the droplets. The supplying of the droplets exhibiting the second charge polarity includes thoroughly spraying the droplets onto the surface of the substrate. The supplying of the droplets exhibiting the second charge polarity includes dripping the droplets from locations corresponding to the emission portions. The intermediate layer arrangement may include a hole injection layer (HIL) arranged on the first electrode layer, a hole transport layer (HTL) arranged on the HIL, the emission layer arranged on the HTL, an electron transport layer (ETL) arranged on the emission layer and an electron injection layer (EIL) arranged on the ETL.

According to yet another aspect of the present invention, there is provided an organic light emitting display device that includes a substrate, a first electrode layer having a pattern arranged on the substrate, an intermediate layer arrangement arranged on the first electrode layer, the intermediate layer arrangement including an emission layer, a second electrode layer having a pattern arranged on the intermediate layer arrangement, the emission layer being produced by a process that includes providing the substrate, wherein one or more pixels comprising emission portions are arranged on a surface of the substrate, providing a mask that includes a plurality of charge inducing units arranged at locations on a surface of the mask that correspond to locations of the emission portions, inducing charges having a first charge polarity on the emission portions by facing the surface of the mask and the surface of the substrate, contacting the charge inducing units of the mask to the emission portions of the substrate, and then separating the mask from the substrate, supplying droplets exhibiting a second and opposite charge polarity to the substrate and forming the emission layer by allowing the droplets exhibiting the second charge polarity to move to the emission portions exhibiting the first charge polarity. The organic light emitting display device may be absent of any pixel defining layer that defines the emission portions. The intermediate layer arrangement may include a hole injection layer (HIL) arranged on the first electrode layer, a hole transport layer (HTL) arranged on the HIL, the emission layer arranged on the HTL, an electron transport layer (ETL) arranged on the emission layer and an electron injection layer (EIL) arranged on the ETL.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIGS. 4 through 8 are diagrams for describing a method of forming an emission layer of an organic light emitting display device according to an embodiment of the present invention;

FIG. 11 illustrates an effect that is created when emission layers are formed according to one or more embodiments of the present invention.

DETAILED DESCRIPTION OF THE INVENTION

The present invention will now be described more fully with reference to the accompanying drawings, in which exemplary embodiments of the invention are shown. The invention may, however, be embodied in many different forms, and should not be construed as being limited to the embodiments set forth herein. Thus, the invention may include all revisions, equivalents, or substitutions which are included in the concept and the technical scope related to the invention. In the description of the present invention, certain detailed explanations of related art are omitted when it is deemed that they may unnecessarily obscure the essence of the invention.

While terms "first" and "second" are used to describe various components, it is obvious that the components are not limited to the terms "first" and "second". The terms "first" and "second" are used only to distinguish between each component. For example, a first component may indicate a second component or a second component may indicate a first component without conflicting with the inventive concept.

Furthermore, all examples and conditional language recited herein are to be construed as being without limitation to such specifically recited examples and conditions. Throughout the specification, a singular form may include plural forms, unless there is a particular description contrary thereto. Also, terms such as "comprise" or "comprising" are used to specify existence of a recited form, a number, a process, an operation, a component, and/or groups thereof, not excluding the existence of one or more other recited forms, one or more other numbers, one or more other processes, one or more other operations, one or more other components and/or groups thereof.

Hereinafter, the present invention will be described in detail by explaining exemplary embodiments of the invention with reference to the attached drawings.

Figure 1:
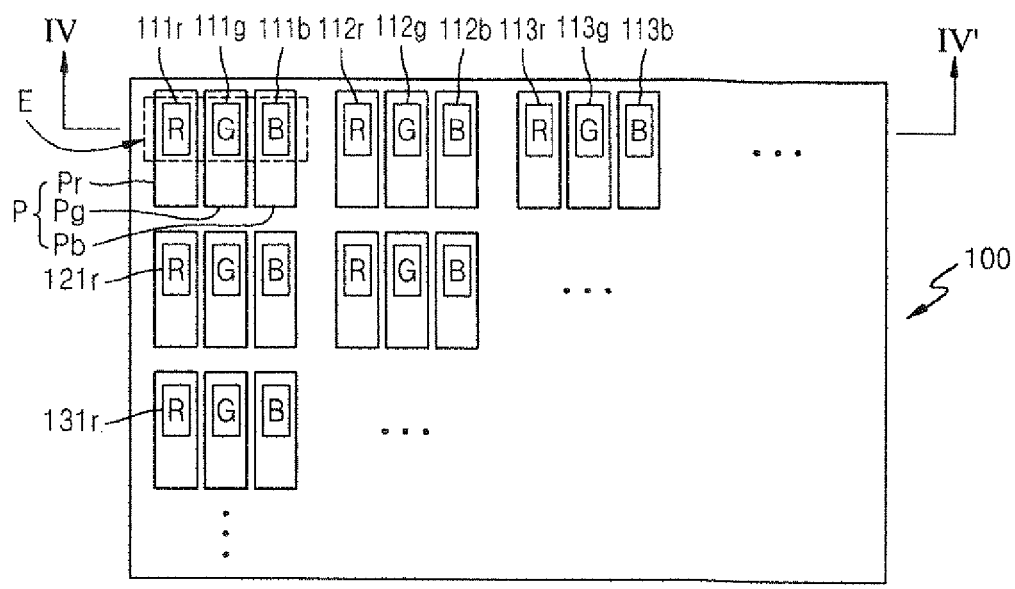
FIG. 1 is a diagram of a substrate used in one or more embodiments of the present invention.

Turning now to FIG. 1, FIG. 1 is a diagram of a substrate 100 used in one or more embodiments of the present invention. Referring to FIG. 1, at least one pixel P including an emission portion E is formed on a surface of the substrate 100. In more detail, the pixel P includes subpixels Pr, Pg, and Pb. Also, the subpixels Pr, Pg, and Pb respectively include emission parts 111r, 111g, and 111b on which different emission layers are to be formed. In FIG. 1, the pixel P includes one red subpixel Pr, one green subpixel Pg, and one blue subpixel Pb, wherein the red subpixel Pr includes the red emission part 111r on which a red (R) emission layer is to be deposited, the green subpixel Pg includes the green emission part 111g on which a green (G) emission layer is to be deposited, and the blue subpixel Pb includes the blue emission part 111b on which a blue (B) emission layer is to be deposited. However, the number of subpixels and the types of emission parts are not limited thereto, and thus may vary.

The pixel P comprising the subpixels Pr, Pg, and Pb including the red, green, and blue emission parts 111r, 111g, and 111b is matrix-arrayed on the substrate 100. That is, the subpixels Pr, Pg, and Pb including the red, green, and blue emission parts 111r, 111g, and 111b, which are different from each other, are alternately and orderly arranged in a row direction on the substrate 100, and subpixels including the same type of emission parts, e.g., red emission parts 111r, 121r, and 131r, are arranged in a column direction on the substrate 100. Referring to FIG. 1, the red, green, and blue subpixels Pr, Pg, and Pb are alternately and orderly arranged on each row of the substrate 100, and subpixels Pr, Pg, or Pb having the same color are arranged on the columns of the substrate 100.

Figure 4:
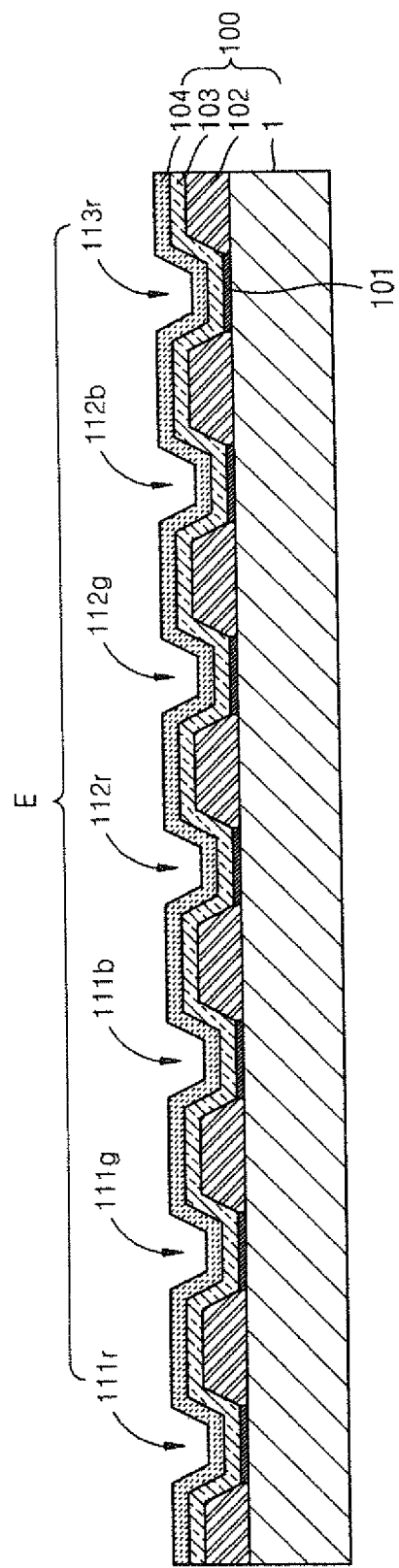

Turning now to FIG. 4, FIG. 4 is a cross-sectional view of the substrate 100, taken along a line IV-IV' of FIG. 1. Referring to FIG. 4, a pixel defining layer (PDL) 102 is arranged on a glass or insulating substrate 1, and the emission portion E is defined by the PDL 102. Also, a first electrode layer 101 having a predetermined pattern is formed on the glass or insulating substrate 1 by using at least one of Indium Tin Oxide (ITO), Indium Zinc Oxide (IZO), ZnO, and $In_2O_3$. An intermediate layer arrangement including red, green and blue emission layers (refer to emission layers EML of FIG. 10) having a predetermined pattern is formed on the first electrode layer 101. In a case where the first electrode layer 101 functions as an anode, the intermediate layer arrangement may further include a hole injection layer (HIL) 103 and a hole transport layer (HTL) 104 that are formed between the first electrode layer 101 and the emission layers (refer to the emission layers EML of FIG. 10). The HIL 103 and the HTL 104 may be formed by performing inkjet printing or spin coating, and the HTL 104 may include a non-conductive material such as poly-(2,4)-ethylene-dihydroxy thiophene (PEDOT), polyaniline (PANI), or the like.

Figure 10:
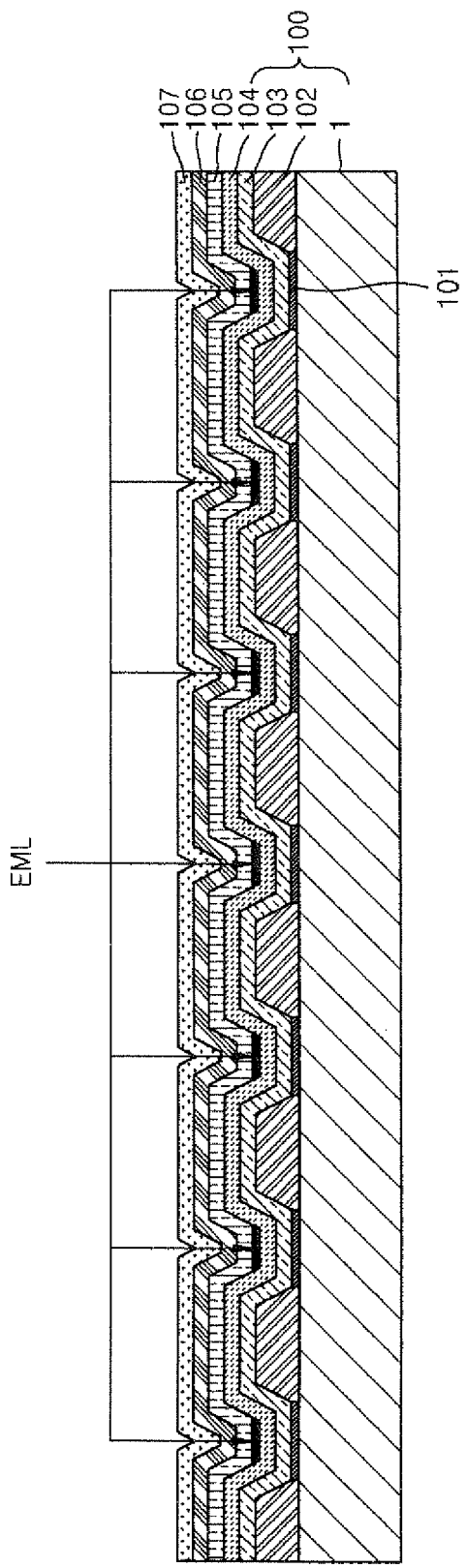
FIG. 10 is a diagram for describing a method of manufacturing an organic light emitting display device according to another embodiment of the present invention.

Referring now to FIG. 10, a second electrode layer 107 is formed on the intermediate layer arrangement. In a case where the second electrode layer 107 functions as a cathode, the intermediate layer arrangement may further include an electron transport layer (ETL) 105 and an electron injection layer (EIL) 106 that are formed between the second electrode layer 107 and the emission layers EML. The ETL 105 and the EIL 106 may be produced by an inkjet printing technique or a spin coating technique.

The intermediate layer arrangement may be made out of an organic material including copper phthalocyanine (CuPc), N,N'-Di(naphthalene-1-yl)-N,N'-diphenyl-benzidine (NPB), tris-8-hydroxyquinoline aluminum (Alq3), or the like. The HIL 103, the HTL 104, the ETL 105, and the EIL 106 are common layers that may be commonly applied to the red, green, and blue subpixels Pr, Pg, and Pb. Also, the aforementioned layers are deposited in an order of the HIL 103, the HTL 104, the emission layers EML, the ETL 105, and the EIL 106, but the deposition structure may vary.

Although not illustrated, in a case of an active matrix type organic light emitting display device, thin film transistors (TFTs) may be respectively electrically connected to first electrodes 101 that are formed from the first electrode layer 101. Furthermore, when deposition of the second electrode layer 107 is complete, a sealing operation may be performed by using an encapsulation substrate, and a driving circuit device may be connected to an external terminal to form an organic light emitting display device.

Hereinafter, for convenience of description, only a method of forming red emission layers on the red emission parts 111r, 112r, and 113r is described in conjunction with FIGS. 2 and 3, but the same method can also be used to form the green emission layers on the green emission parts 111g, 112g, and 113g, and the blue emission layers on the blue emission parts 111b, 112b and 113b.

Figure 2:
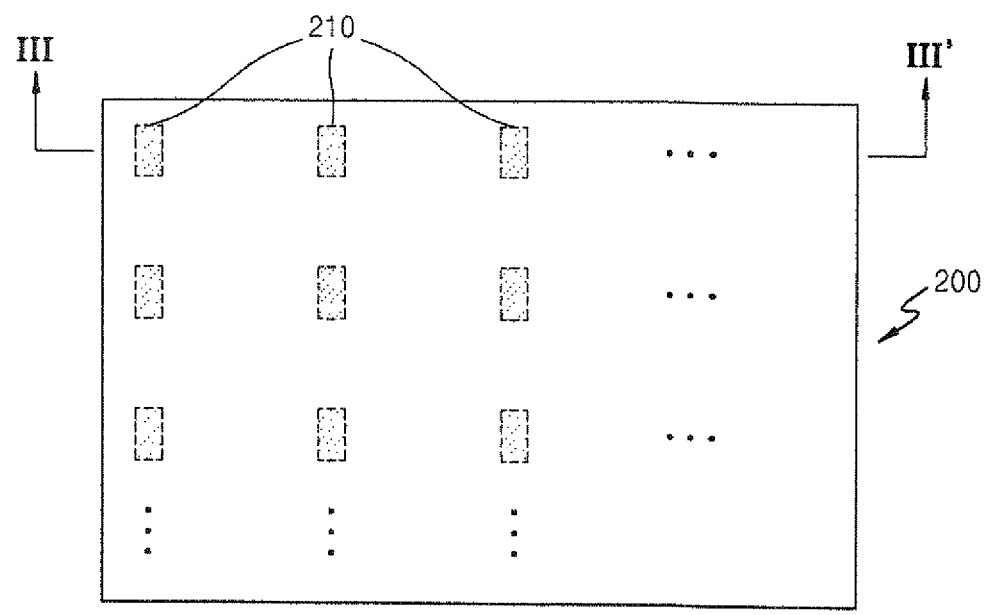
FIG. 2 is a diagram of a mask used in one or more embodiments of the present invention.
Figure 3:
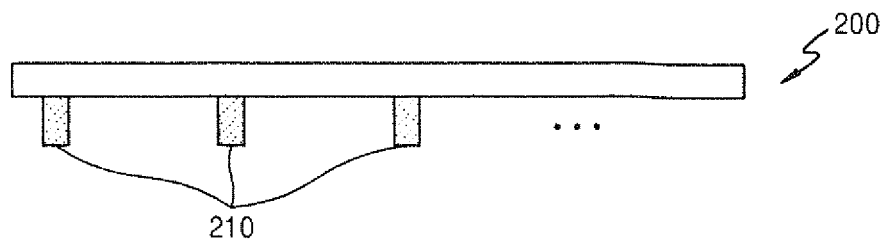
FIG. 3 is a cross-sectional view of the mask, taken along a line III-III' of FIG. 2.

Turning now to FIGS. 2 and 3, FIG. 2 is a diagram of a mask 200 used in one or more embodiments of the present invention and FIG. 3 is a cross-sectional view of the mask 200, taken along a line III-III' of FIG. 2. Referring now to FIGS. 2 and 3, the mask 200 includes one or more charge inducing units 210 that correspond to locations of the emission portions E of the substrate 100 of FIG. 1. In more detail, the mask 200 includes the charge inducing units 210 disposed in such a manner that the charge inducing units 210 correspond to locations of the emission portions E corresponding to one type among the red, green, and blue subpixels Pr, Pg, and Pb of the substrate 100. As illustrated in FIG. 2, the charge inducing units 210 are disposed so as to correspond to locations of the red emission parts 111r, 112r, and 113r on which the red emission layers of an organic light emitting display device are to be formed.

Thus, the number of charge inducing units 210 is equivalent to the number of red subpixels Pr on the substrate 100. In other words, the number of charge inducing units 210 is equivalent to the number of red emission parts on the substrate 100. Thus, an emission layer forming method according to an embodiment of the present invention is advantageous in that emission layers of the same type on the substrate 100, e.g., emission layers having the same color on the substrate 100, may be formed by performing a single process.

Each charge inducing unit 210 is made out of a conductive material. For example, each charge inducing unit 210 may include Cu, Ag, Al, Pt, Pd, Au, Ni, or Li. Thus, it is possible to use a principle in which, when a conductive object contacts a non-conductive object, a negative charge is induced on a surface of the non-conductive object. In more detail, when the charge inducing units 210 respectively contact surfaces of the emission portions E, negative charges are induced on the surfaces of the emission portions E.

An area and a shape of the charge inducing units 210 respectively contacting the emission portions E are the same as those of the surfaces of the emission portions E. In FIG. 1, the emission portions E have a rectangular shape, and thus in FIGS. 2 and 3, the charge inducing units 210 have a rectangular shape so as to have the same size, area, and shape as the emission portions E. However, the sizes, the areas, and the shapes of the emission portions E and the charge inducing units 210 are not limited thereto and thus may vary.

Turning now to FIGS. 4 through 8, FIGS. 4 through 8 are diagrams for describing a method of forming an emission layer of an organic light emitting display device according to an embodiment of the present invention. Referring to FIG. 4, a substrate 100 whereon subpixels Pr, Pg, and Pb including emission portions E are arranged, is provided. A first electrode layer 101 having a predetermined pattern is formed on the substrate 100. An HIL 103 is formed on the first electrode layer 101 and an HTL 104 is formed on the HIL 103. Here, an emission layer (not shown) is formed on the HTL 104. Hereinafter, as an example, a procedure for forming emission layers on emission parts of red subpixels will now be described. In this regard, the emission parts of the red subpixels are indicated as red emission parts 111r, 112r, and 113r.

Figure 5A:
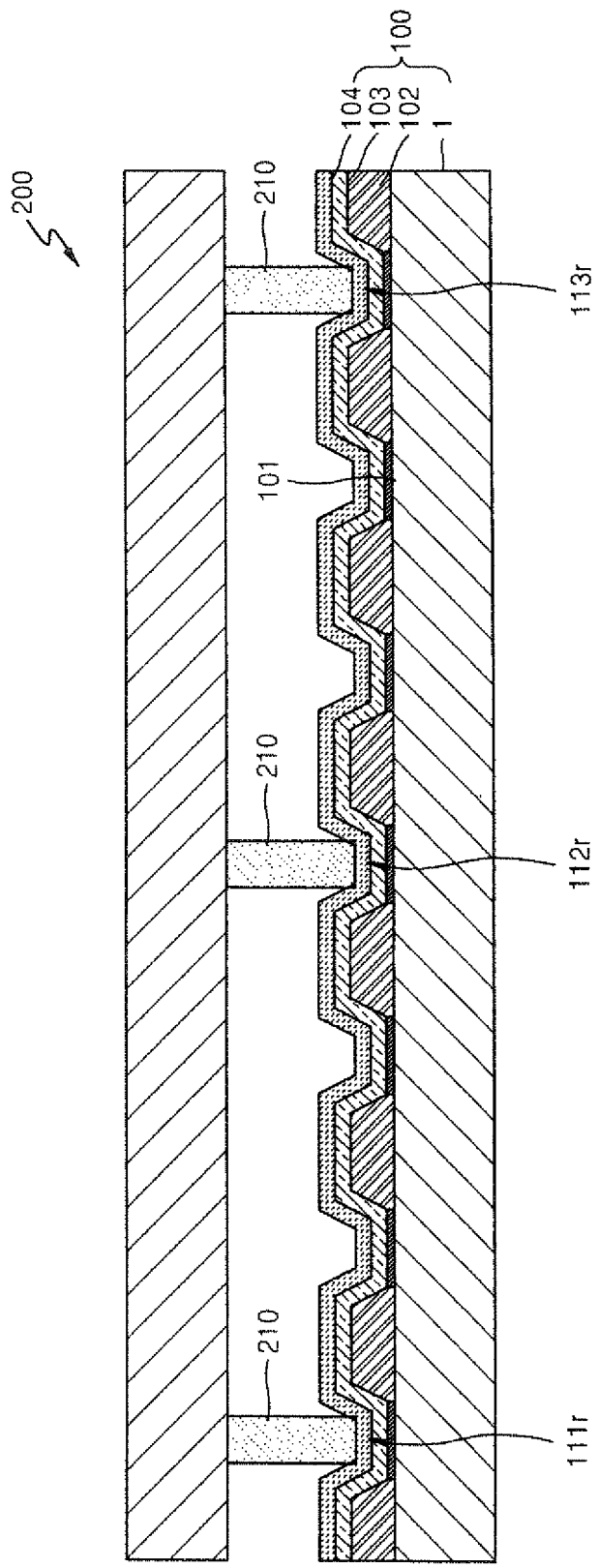

Referring to FIG. 5A, a mask 200 is provided, wherein charge inducing units 210 corresponding to the red emission parts 111r, 112r, and 113r are arranged on a surface of the mask 200, a surface of the substrate 100 and the surface of the mask 200 are disposed to face each other, and then the charge inducing units 210 contact the red emission parts 111r, 112r, and 113r. Since the charge inducing units 210 are made out of a conductive material and the red emission parts 111r, 112r, and 113r are made out of a non-conductive material, negative charges are induced on surfaces of the red emission parts 111r, 112r, and 113r via the contact with the charge inducing units 210. Here, since the surfaces of the red emission parts 111r, 112r, and 113r are easily damaged by pressure, the charge inducing units 210 only gently contacts the red emission parts 111r, 112r, and 113r and a large amount of pressure is not applied.

Referring to FIG. 5A, the charge inducing units 210 contact the red emission parts 111r, 112r, and 113r so that negative charges are induced on only the red emission parts 111r, 112r, and 113r. That is, surface charges are not induced on portions corresponding to surfaces of emission parts 111g, 111b, 112g, and 112b of subpixels having different colors and a surface of a PDL 102.

Figure 5B:
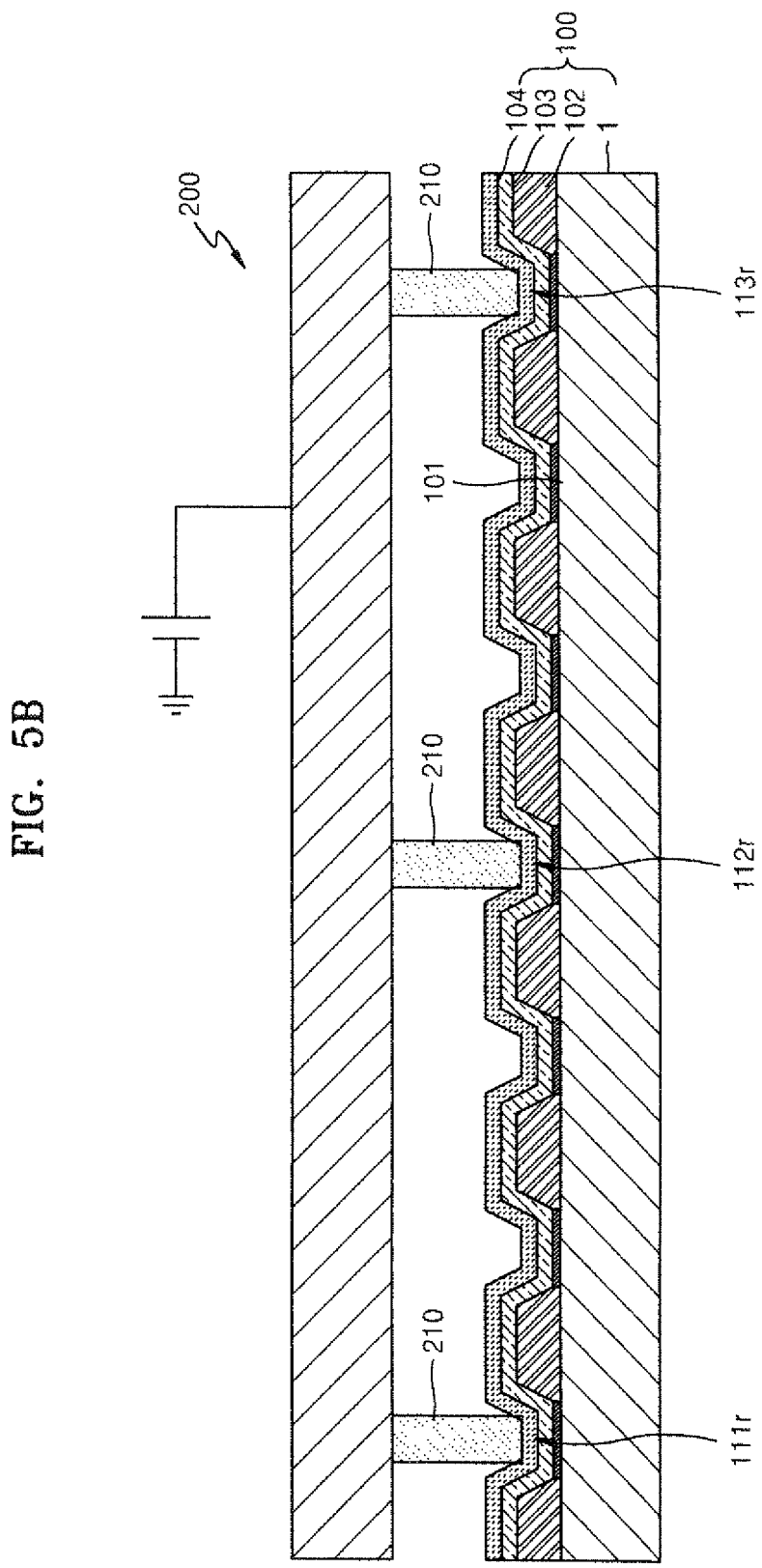

Turning now to FIG. 5B, FIG. 5B illustrates a variation of the embodiment of FIG. 5A. In the variation of FIG. 5B, after the charge inducing units 210 contact the red emission parts 111r, 112r, and 113r, a voltage is applied to the mask 200 so that surface charges having negative polarity are induced on the red emission parts 111r, 112r, and 113r. Here, according to the polarity of the voltage applied to the mask 200, the red emission parts 111r, 112r, and 113r may be charged to have a positive polarity or a negative polarity. The variation of FIG. 5B is advantageous in that surface charges are intensively induced, compared to the case of FIG. 5A in which surface charges are induced only by contact with the charge inducing units 210.

Referring now to FIG. 6, the mask 200 and the substrate 100 contacting each other are separated. At this time, it is possible to verify that negative charges have been induced on the red emission parts 111r, 112r, and 113r of the substrate 100.

Figure 8:
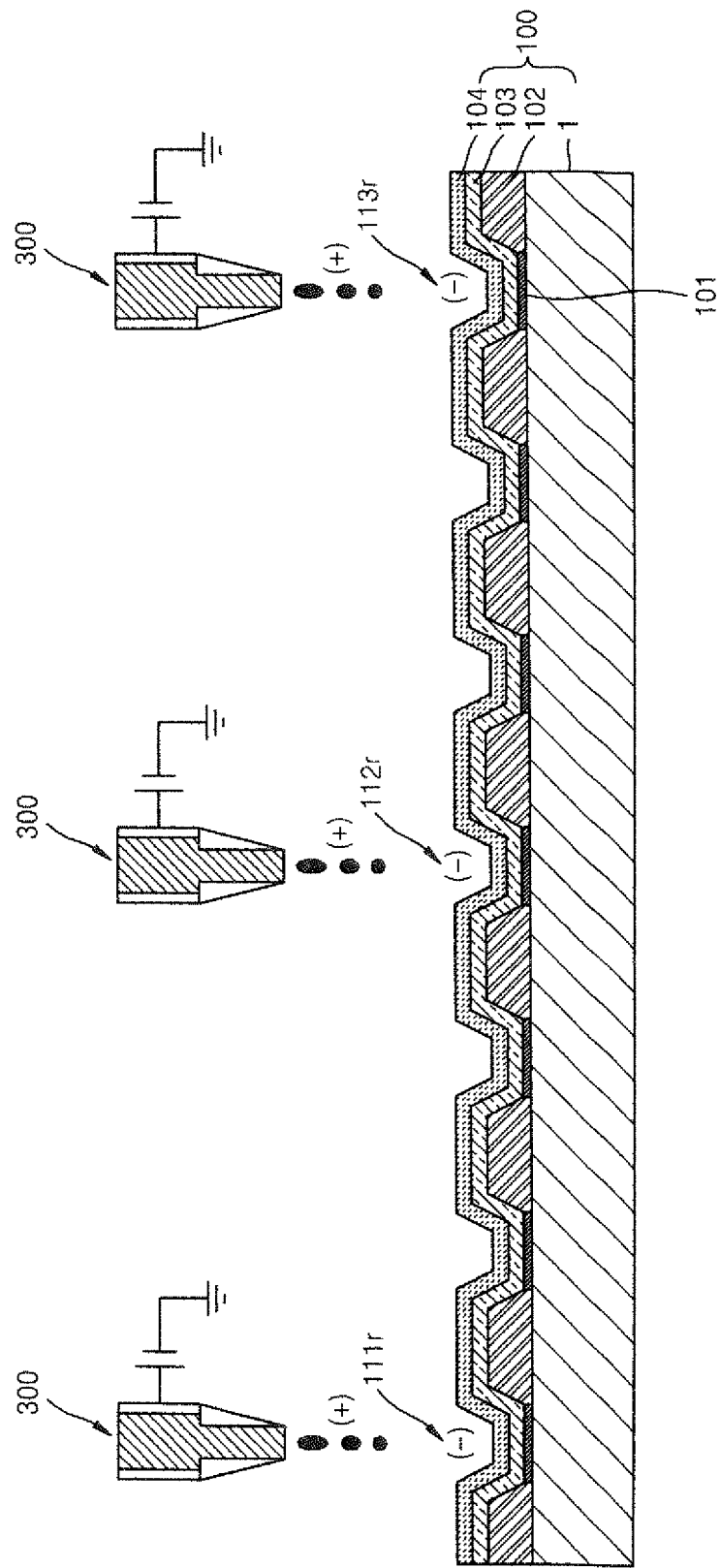

Referring now to FIGS. 7 and 8, droplets that are positively charged are supplied to the substrate 100. Here, the droplets function to form emission layers having various colors, and may be made out of a Poly-Phenylenevinylene (PPV)-based polymer material, a polyfluorene-based polymer material, or the like. According to the present embodiment, the droplets may be positively charged by applying a voltage to a nozzle 300 that supplies the droplets. In more detail, a predetermined voltage, e.g., a voltage between about 4 kV and about 15 kV, is applied to a ground voltage source of the nozzle 300, and when an appropriate amount of liquid is supplied to the nozzle 300, the droplets may be supplied to the substrate 100 in various manners according to the intensity of an electric field, and a flow amount. Here, a supply area and a supply speed of droplets per one supply may be controlled by the voltage. In general, the supplied droplets are positively charged. However, the charge of the droplets is not limited thereto, and thus may be positively or negatively charged according to the polarity of the voltage applied to the nozzle 300. The droplets flowing from the nozzle 300 are circular-shaped due to surface tension, but may instead be oval-shaped as the voltage applied to the nozzle 300 increases.

Referring now to FIG. 7, the droplets may be supplied in such a manner that the droplets are thoroughly sprayed on the surface of the substrate 100. The sprayed droplets, which are positively charged, move to the red emission parts 111r, 112r, and 113r on which negative charges are induced to form emission layers. Due to attraction between the droplets and the red emission parts 111r, 112r, and 113r, the droplets are deposited on the red emission parts 111r, 112r, and 113r to form the emission layers. The aforementioned method is advantageous in that emission layers may be simultaneously formed on a plurality of red emission parts 111r, 112r, and 113r that are formed on a large substrate.

Referring now to FIG. 8, in a variation to the method of FIG. 7, droplets may be supplied to the red emission parts 111r, 112r, and 113r by being dropped from locations that only correspond to the red emission parts 111r, 112r, and 113r. Here, a plurality of nozzles 300 for supplying the droplets may be arranged in row or column direction of subpixels, and then may simultaneously form emission layers on emission parts that are disposed in the row or column direction. According to this method, a thickness and a shape of each emission layer may be easily controlled by controlling a voltage of each nozzle 300.

Figure 9:
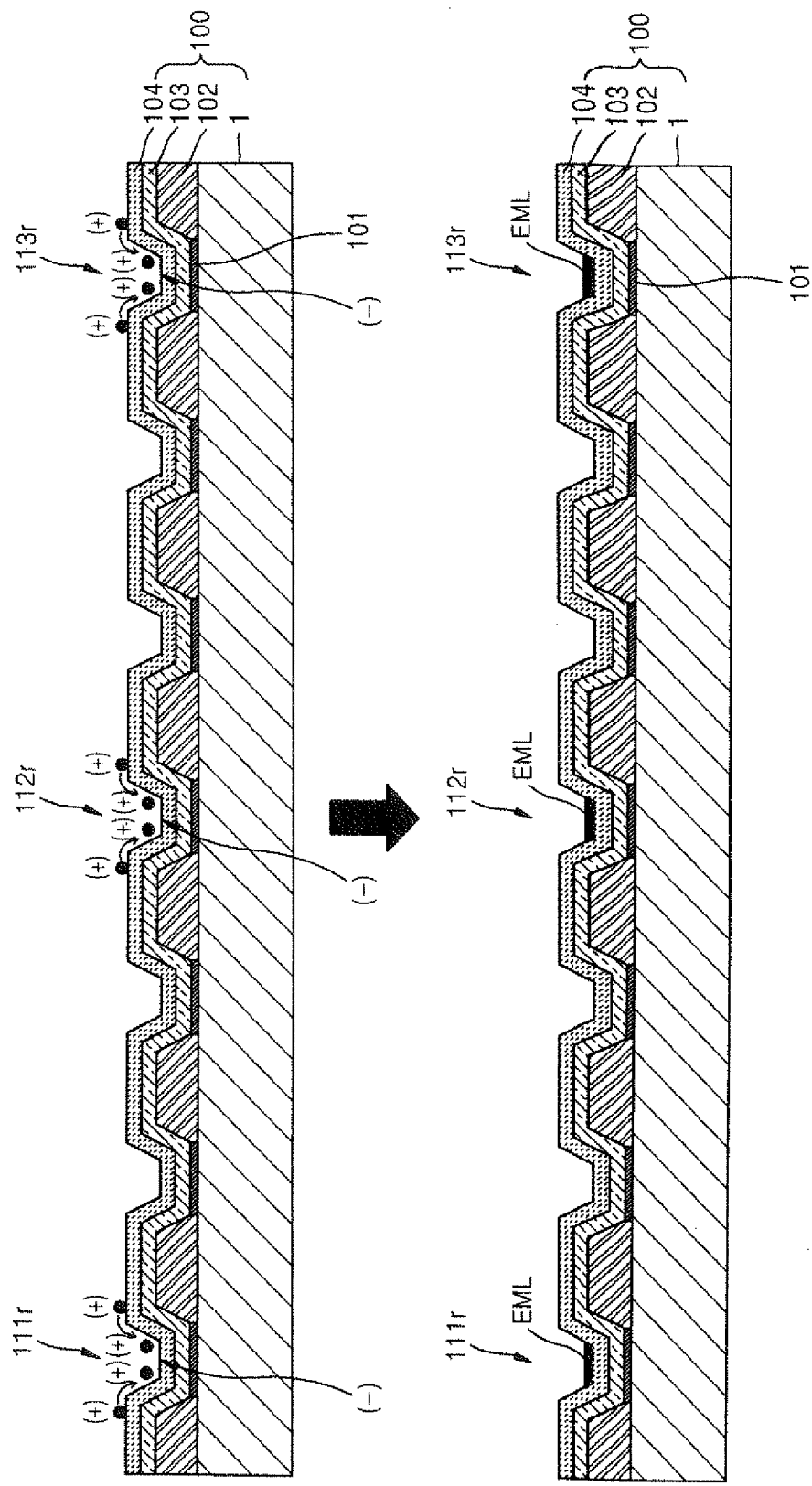
FIG. 9 is a diagram for describing a principle in which emission layers are formed by using one or more embodiments of the present invention.

Turning now to FIG. 9, FIG. 9 is a diagram for describing a principle in which emission layers are formed by using one or more embodiments of the present invention. Referring to FIG. 9, a portion of a surface of a substrate 100 other than red emission parts 111r, 112r, and 113r on which surface charges are induced is in a hydrophobic state. Thus, droplets are easily separated from the surface of the substrate 100, and repulsion exists between the droplets exhibiting the same positive polarity. Thus, when the droplets are dropped on parts other than the red emission parts 111r, 112r, and 113r on which the surface charges are induced, the droplets move to the red emission parts 111r, 112r, and 113r exhibiting negative polarity. The droplets dropped on the red emission parts 111r, 112r, and 113r on which the surface charges are induced are solidified on the red emission parts 111r, 112r, and 113r due to attraction to the negative charges that are induced on the surfaces of the red emission parts 111r, 112r, and 113r. Due to this principle, the emission layers are formed only on the red emission parts 111r, 112r, and 113r contacting charge inducing units 210.

Turning now to FIG. 10, FIG. 10 is a diagram for describing a method of manufacturing an organic light emitting display device according to another embodiment of the present invention. Referring to the method of FIG. 10, intermediate layer arrangements including emission layers EML and a second electrode layer 107 are formed on first electrodes 101 and pixel defining layer 102 by using the method described with reference to FIGS. 4 through 9, to manufacture the organic light emitting display device. Although the method of forming emission layers of red subpixels is described with reference to FIGS. 4 through 9, emission layers of green and blue subpixels are formed by repeating the method described with reference to FIGS. 4 through 9 to produce the structure of FIG. 10. Then, an ETL 105 and an EIL 106 are sequentially formed on the emission layers EML by performing inkjet printing or spin coating. Afterward, the second electrode layer 107 is formed.

In a case of a bottom emission type organic light emitting display device in which an image is realized toward a glass or insulating substrate 1, a first electrode layer 101 may be a transparent electrode including ITO, IZO, ZnO, or $In_2O_3$, and the second electrode layer 107 may be a reflective electrode. Here, the second electrode layer 107 may be made out of a metal material having a low work function, such as Ag, Mg, Al, Pt, Pd, Au, Ni, Nd, Ir, Cr, Li, or Ca. However, in a case of a top emission type organic light emitting display device in which an image is realized toward the second electrode layer 107, the first electrode layer 101 may be a reflective electrode and the second electrode layer 107 may be a transparent electrode. In a case of a dual emission type organic light emitting display device, both the first electrode layer 101 and the second electrode layer 107 may be transparent electrodes.

The method of forming an emission layer of an organic light emitting display device, the method of manufacturing the organic light emitting display device including the emission layer, and the organic light emitting display device thereof according to the one or more embodiments of the present invention have advantages described below.

First, in order to form an emission layer according to the related art, a mask including openings is used, but this manner causes problems such as a shadow effect, spots, and a spread of an emission material. However, according to the one or more embodiments of the present invention, surface charges are induced on emission parts by a mask 200 and then the mask 200 is separated from the emission parts, to solve the aforementioned problems. In addition, according to the one or more embodiments of the present invention, highly expensive vacuum equipment necessary for emission layer formation according to the related art is not required.

Second, emission layers are formed by attraction between emission parts and droplets exhibiting different charge polarities, so that it is not necessary to form a PDL 102 in the shape of a dam to define subpixels. In an emission layer forming method according to the related art, an emission material cannot be deposited unless emission parts are defined by using the PDL 102. However, according to the one or more embodiments of the present invention, emission layers are formed by using attraction and repulsion due to an electrostatic force, so that a process for forming the PDL 102 or openings may be omitted.

Turning now to FIG. 11, FIG. 11 illustrates an effect that is created when emission layers are formed according to one or more embodiments of the present invention. Referring to FIG. 11, without a PDL 102, only a first electrode layer 101, a HIL 103, and a HTL 104 may be formed on a glass or insulating substrate 1, and then emission layers may be formed on the HTL 104. By being able to omit PDL 102, a manufacturing process maybe be simplified, productivity may be increased, manufacturing costs may be reduced, a yield rate may be increased, and reliability deterioration due to formation of a PDL according to the related art may be resolved.

Third, according to the one or more embodiments of the present invention, the emission layers may be formed without being limited by a size of a substrate, so that it is advantageous in manufacturing a large display.

While the method of forming an emission layer, and the organic light emitting display device thereof are described in the one or more embodiments of the present invention, the present invention is not limited to the formation of the emission layer but may be used to form various other layers including the HIL 103, the HTL 104, an ETL 105, and an EIL 106. Also, the present invention may be used to manufacture various other display devices as well as the organic light emitting display device.

In the one or more embodiments of the present invention, the method of forming the emission layers on red emission parts 111r, 112r, and 113r was described, but the method may also be applied to form emission layers on green and blue emission parts. For example, when red, green, and blue emission layers are formed on a substrate via three processes while a mask including charge inducing units is moved by an amount corresponding to one subpixel, emission layers may be formed on emission parts of all pixels formed on the substrate.

Although other configuring elements are not illustrated between a substrate and emission parts of subpixels shown in FIGS. 1 through 10, this is for convenience of description and thus the one or more embodiments are not limited thereto. For example, a plurality of TFTs, a plurality of capacitors, and electronic devices for driving the organic light emitting display device may also be included between the substrate and the emission parts. Exceptionally, FIG. 11 schematically illustrates a driving TFT for driving the organic light emitting display device. The driving TFT is formed in each subpixel.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of forming an emission layer of an organic light emitting display device, the method comprising:
providing a substrate including at least one pixel comprising emission portions are arranged on a surface of the substrate;
providing a mask including a plurality of charge inducing units arranged on a surface of the mask that correspond to locations of the emission portions;
inducing charges having a first charge polarity on the emission portions by facing the surface of the mask and the surface of the substrate, contacting the charge inducing units of the mask to the emission portions of the substrate, and then separating the mask from the substrate;
supplying droplets exhibiting a second and opposite charge polarity to the substrate; and
forming the emission layer by allowing droplets exhibiting the second and opposite charge polarity to be attracted to and move to the emission portions exhibiting the first charge polarity.

2. The method of claim 1, wherein the one or more pixels each comprise one or more subpixels and the one or more subpixels comprise emission parts on which different types of emission layers are to be formed, and wherein, when the one or more subpixels comprising different emission parts are sequentially and alternately arranged in a row direction on the substrate, and the one or more subpixels comprising the same emission parts are arranged in a column direction on the substrate, the mask comprises the charge inducing units corresponding to locations of same emission parts of the one or more subpixels.

3. The method of claim 1, wherein surfaces of the emission portions contacting the charge inducing units are comprised of a non-conductive material, and the charge inducing units are comprised of a conductive material.

4. The method of claim 1, wherein an area and a shape of each of the charge inducing units contacting the emission portions are equivalent to an area and a shape of each of the emission portions.

5. The method of claim 1, wherein after the charge inducing units of the mask contact the emission portions of the substrate, charges having the first charge polarity are induced on the emission portions by applying a voltage to the mask.

6. The method of claim 1, wherein the droplets are charged to have the second and opposite charge polarity by applying a voltage to a nozzle that supplies the droplets.

7. The method of claim 1, wherein the supplying of the droplets exhibiting the second and opposite charge polarity comprises thoroughly spraying the droplets on the surface of the substrate.

8. The method of claim 1, wherein the supplying of the droplets exhibiting the second and opposite charge polarity comprises dripping the droplets from locations corresponding to the emission portions.

9. A method of manufacturing an organic light emitting display device, the method comprising:

forming a first electrode layer having a predetermined pattern on a substrate;

forming an intermediate layer arrangement comprising an emission layer having a predetermined pattern on the first electrode layer; and forming a second electrode layer having a predetermined pattern on the intermediate layer arrangement, wherein the forming of the emission layer comprises:

providing the substrate, wherein one or more pixels comprising emission portions are arranged on a surface of the substrate;

providing a mask that includes a plurality of charge inducing units arranged at locations on a surface of the mask that correspond to locations of the emission portions;

inducing charges having a first charge polarity on the emission portions by facing the surface of the mask and the surface of the substrate, contacting the charge inducing units of the mask to the emission portions of the substrate, and then separating the mask from the substrate;

supplying droplets exhibiting a second and opposite charge polarity to the substrate; and forming the emission layer by allowing the droplets exhibiting the second and opposite charge polarity to move to the emission portions exhibiting the first charge polarity.

10. The method of claim 9, wherein the one or more pixels each comprise one or more subpixels and the one or more subpixels comprise emission parts on which different types of emission layers are to be formed, and wherein, when the one or more subpixels comprising different emission parts are sequentially and alternately arranged in a row direction on the substrate, and the one or more subpixels comprising the same emission parts are arranged in a column direction on the substrate, the mask comprises the charge inducing units corresponding to locations of same emission parts of the one or more subpixels.

11. The method of claim 9, wherein surfaces of the emission portions contacting the charge inducing units are comprised of a non-conductive material, and the charge inducing units are comprised of a conductive material.

12. The method of claim 9, wherein an area and a shape of each of the charge inducing units contacting the emission portions are equivalent to an area and a shape of each of the emission portions.

13. The method of claim 9, wherein after the charge inducing units of the mask contact the emission portions of the substrate, charges having the first charge polarity are induced on the emission portions by applying a voltage to the mask.

14. The method of claim 9, wherein the droplets are charged to have the second and opposite charge polarity by applying a voltage to a nozzle that supplies the droplets.

15. The method of claim 9, wherein the supplying of the droplets exhibiting the second and opposite charge polarity comprises thoroughly spraying the droplets onto the surface of the substrate.

16. The method of claim 9, wherein the supplying of the droplets exhibiting the second and opposite charge polarity comprises dripping the droplets from locations corresponding to the emission portions.

17. The method of claim 9, wherein the intermediate layer arrangement comprises:

a hole injection layer (HIL) arranged on the first electrode layer;

a hole transport layer (HTL) arranged on the HIL;

the emission layer arranged on the HTL;

an electron transport layer (ETL) arranged on the emission layer; and an electron injection layer (EIL) arranged on the ETL.

* * * * *